United States Patent
Casper et al.

(10) Patent No.: US 6,242,782 B1
(45) Date of Patent: *Jun. 5, 2001

(54) CIRCUIT FOR PROVIDING ISOLATION OF INTEGRATED CIRCUIT ACTIVE AREAS

(75) Inventors: Stephen L. Casper; Brian M. Shirley; Kevin G. Duesman, all of Boise, ID (US)

(73) Assignee: Micron Technology, Inc., Boise, ID (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 09/124,283

(22) Filed: Jul. 29, 1998

Related U.S. Application Data

(63) Continuation of application No. 08/543,160, filed on Oct. 13, 1995, now Pat. No. 5,834,820.

(51) Int. Cl.[7] .................................................. H01L 29/94
(52) U.S. Cl. .......................... 257/394; 257/314; 257/315; 257/316; 257/317; 257/318; 257/319; 257/320; 257/321; 257/322; 257/323; 257/324; 257/325; 257/326; 257/374; 257/395; 257/396; 257/397; 257/510; 257/547; 257/630; 257/648; 307/296.2; 307/296.4; 307/296.5; 307/127
(58) Field of Search .................................. 257/394, 374, 257/396, 397, 398, 510, 647, 648, 314, 630, 315, 316, 317, 318, 319, 320, 321, 322, 323, 324, 325, 326; 307/296.2, 296.4, 296.5, 127

(56) References Cited

U.S. PATENT DOCUMENTS

| | | |
|---|---|---|
| 4,033,788 | 7/1977 | Hunsperger et al. .................. 148/1.5 |
| 4,380,113 | 4/1983 | Malwah ................................. 29/577 |
| 4,441,246 | 4/1984 | Redwine ............................... 29/571 |
| 4,466,177 | 8/1984 | Chao et al. ........................... 29/571 |
| 4,507,159 | 3/1985 | Erb ...................................... 148/190 |
| 4,570,331 * | 2/1986 | Eaton, Jr. et al. ..................... 29/576 |
| 4,720,467 | 1/1988 | Muggli et al. ......................... 437/52 |
| 4,734,751 | 3/1988 | Hwang et al. ......................... 357/22 |
| 4,849,366 * | 7/1989 | Hsu et al. .............................. 437/42 |
| 4,937,756 | 6/1990 | Hsu et al. ............................. 364/490 |
| 5,159,207 | 10/1992 | Pavlin et al. ......................... 307/296 |
| 5,164,806 * | 11/1992 | Nagatomo et al. ................... 257/395 |
| 5,279,984 | 1/1994 | Kinoshita et al. ..................... 437/52 |
| 5,355,012 | 10/1994 | Yamaguchi et al. ................. 257/409 |
| 5,510,638 | 4/1996 | Lancaster et al. ................... 257/314 |
| 5,656,837 | 8/1997 | Lancaster et al. ................... 257/314 |
| 5,834,820 * | 11/1998 | Caper et al. ......................... 257/394 |

\* cited by examiner

*Primary Examiner*—Eddie C. Lee
*Assistant Examiner*—Matthew E. Warren
(74) *Attorney, Agent, or Firm*—Schwegman, lundberg, Woessner & Kluth, P.A.

(57) ABSTRACT

The provision of an isolation gate connecting unassociated active areas of adjacent transistors formed in a semiconductor substrate provides effective isolation of the adjacent transistors with no additional process steps required. The isolation gate is tied to a reference to ensure that a channel between the unassociated active areas is not formed, and effective isolation is provided. The adjacent transistors are cross coupled to form sense amplifiers for dynamic random access memory devices.

32 Claims, 3 Drawing Sheets

CIRCUIT FOR PROVIDING ISOLATION OF INTEGRATED CIRCUIT ACTIVE AREAS

This application is a continuation of U.S. Ser. No. 08/543,160, filed Oct. 13, 1995 now U.S. Pat. No. 5,834,820.

FIELD OF THE INVENTION

The present invention relates to a method and apparatus for isolating active areas of semiconductor circuitry, and in particular to the use of a grounded gate between such active areas.

BACKGROUND OF THE INVENTION

In the formation of semiconductor chip circuitry such as sources and drains of field effect transistors, it is important that the active areas of the transistors be separated so that electrical current does not flow between them in an unintended manner. Active areas of a transistor are defined as the areas of a transistor where current flows, such as the source and drain of an insulated gate field effect transistor. It is desirable to place unassociated transistors as close together as possible to minimize the total chip area taken up by the transistors. As the space between unassociated transistors shrinks, there is still a need to maintain total electrical isolation between the unassociated transistors. Prior solutions have relied on thick field oxides to achieve isolation, as seen in prior art FIG. 1.

One problem with the use of field oxide isolation to provide isolation of active areas of adjacent unassociated transistors arises during formation of the oxide layer. When the oxide is formed, it has the tendency to creep under a masking nitride layer, toward the gates of the unassociated transistors. Any misalignment of the gates with respect to the oxide layer causes unbalancing of the transistors, especially when trying to obtain close spacing to conserve real estate on the chip. This unbalancing is the result of one active area being larger than the other active area, and exhibiting different resistance and capacitance. To minimize such problems, the distance between the transistors is increased, resulting in less efficient use of the chip. In dynamic random access memory chips, both efficient use of chip space, and precisely balanced circuits, such as are used in sense amplifiers are critical as the memory capacity of such chips increases.

There is a need to provide effective isolation of unassociated circuitry using as little chip real estate as possible while at the same time providing precisely balanced circuitry.

SUMMARY OF THE INVENTION

An isolating gate is formed between two unassociated transistors in a semiconductor device to provide electrical isolation between the two transistors. The gate is biased to ensure that the field effect transistor formed between the active areas of the adjacent transistors is in an off condition. Keeping the isolating gate biased off takes advantage of the self isolating features of enhancement mode field effect transistors, and provides isolation with much less distance required between the active areas of the adjacent transistors. Since the active transistor gates and the isolation gate are formed at the same time, no misalignment occurs, unlike prior field oxide isolation techniques, where the isolation and transistor gates are formed using separate masks which are easily misaligned. This in turn provides the ability to provide a higher density of transistors on a given semiconductor die. The transistors are much more precisely balanced due to the use of the single mask to form all the gates. In addition, fewer process steps are required to provide the semiconductor device.

In one embodiment, the transistors comprise n-channel insulated gate field effect transistors. The isolating gate is coupled to ground. In a further embodiment, the transistors comprise p-channel insulated gate field effect transistors having the isolating gate coupled to Vcc. In both such embodiments, the isolating gate is held in an off condition by the reference voltage to provide effective isolation of the unassociated transistors.

In a further embodiment, pairs of transistors form sense amplifiers for dynamic random access memory devices. A first pair of transistors is isolated by the isolating gate from a second pair. Sense amplifiers are cross coupled enhancement mode field effect transistors, and the pair of transistors must be precisely balanced and isolated from other sense amplifiers in order to provide correct sensing of memory cells in the memory device. The present invention provides the ability to pack sense amplifiers closer together while still providing effective isolation and not adversely affecting the balanced relationship between the transistors forming the sense amplifiers.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 1:
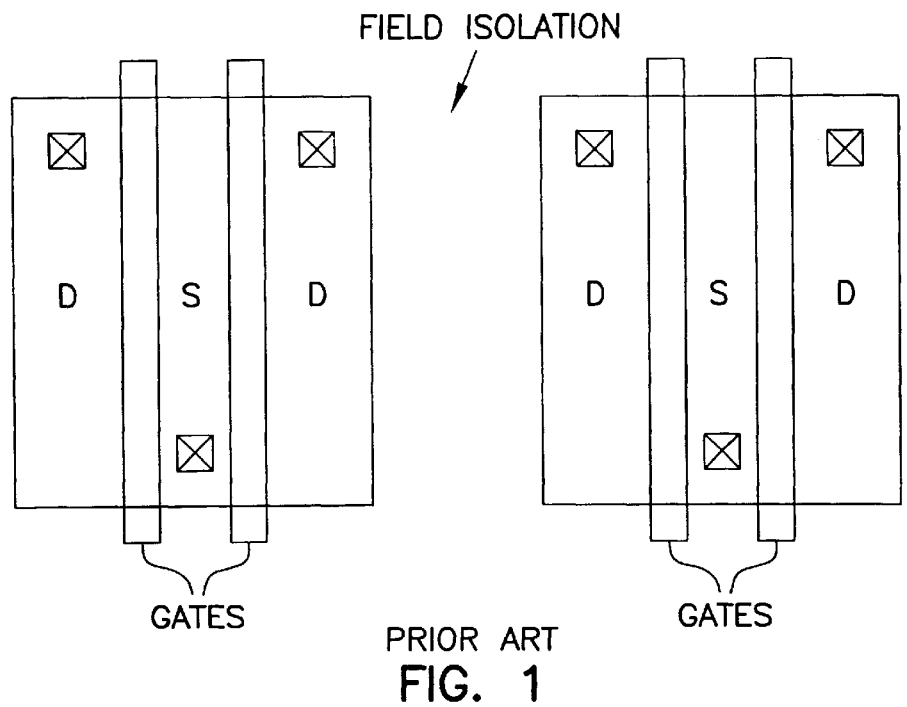
FIG. 1 is a prior art planar view of one manner of providing isolation of unassociated transistors.
Figure 2:
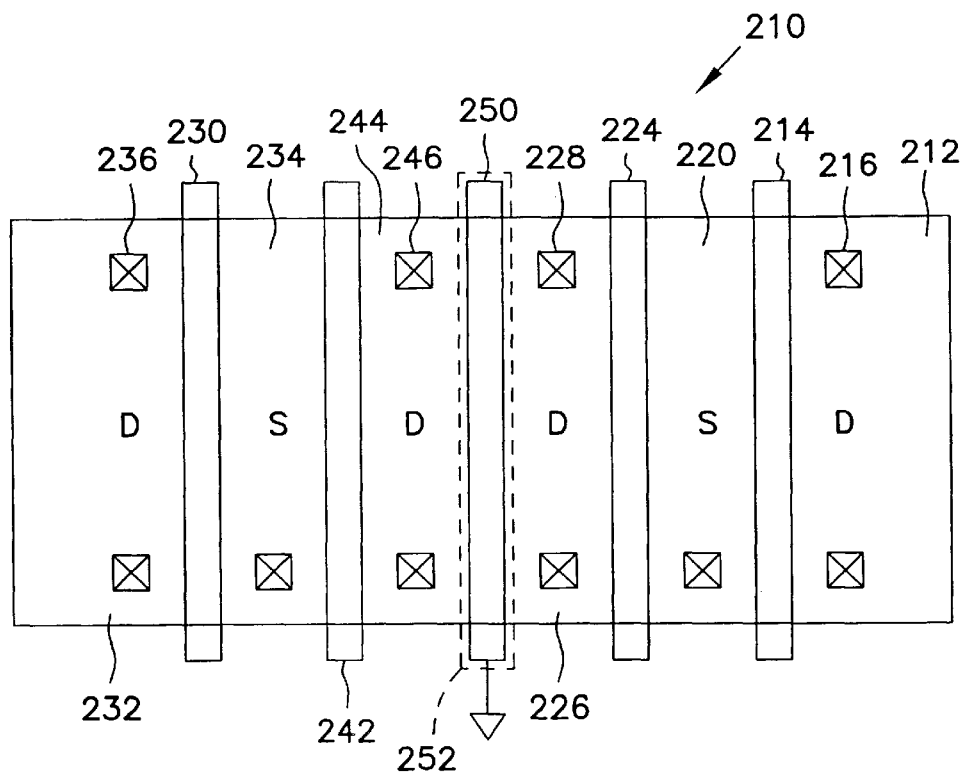
FIG. 2 is a planar view of unassociated transistors and an isolating gate for providing isolation of the unassociated transistors.

In FIG. 2, multiple transistors are formed in a semiconductor shown generally at 210 in planar form. In one embodiment, the transistors are n-channel, isolated gate, enhancement mode, field effect transistors formed in a silicon substrate. They form part of a balanced n-sense amplifier for a dynamic random access memory device. The transistors are also useful in other circuitry. A drain 212 of a first transistor is formed by diffusing an impurity selected to promote either electrons or holes. In one embodiment, all of the sources and drains are n+ type doped. The drain 212 extends partially beneath a first gate 214 which is formed of polysilicon, and is insulated from the drain 212 and other active areas by a suitable insulating material such as silicon dioxide. A contact 216 for the drain 212 is formed of polysilicon, metal or other suitable conductor for providing electrical contact. A source 220 for the first transistor is formed on the other side of the first gate 214 at the same time and with the same doping as the drain 212. The source 220 also is partially covered by the first gate 214.

Source 220 also serves as a source for a second transistor which has a gate 224 formed partially overlapping source 220. A drain 226 is formed on the other side of gate 224, being partially overlapped by gate 224. A contact 228 provides for electrical contact to the drain 226.

At the other end of FIG. 2, a third and a fourth transistor are similarly formed. The third transistor comprises a gate 230, a drain 232, and a source 234. A contact 236 provides for electrical contact to the drain 232. The fourth transistor shares source 234 with the transistor associated with gate 230. A gate 242, a drain 244 and a contact 246 complete the fourth transistor.

In one embodiment, all of the sources and drains are formed at the same time by common semiconductor process steps such as diffusion or ion implantation. Other ways to form them will be apparent to those skilled in the art. The gates are formed of polysilicon, and at least partially overlap the sources and drains to create a conductive channel in the normal manner. The gates may also be formed of other conductive materials, such as metal.

Figure 3:
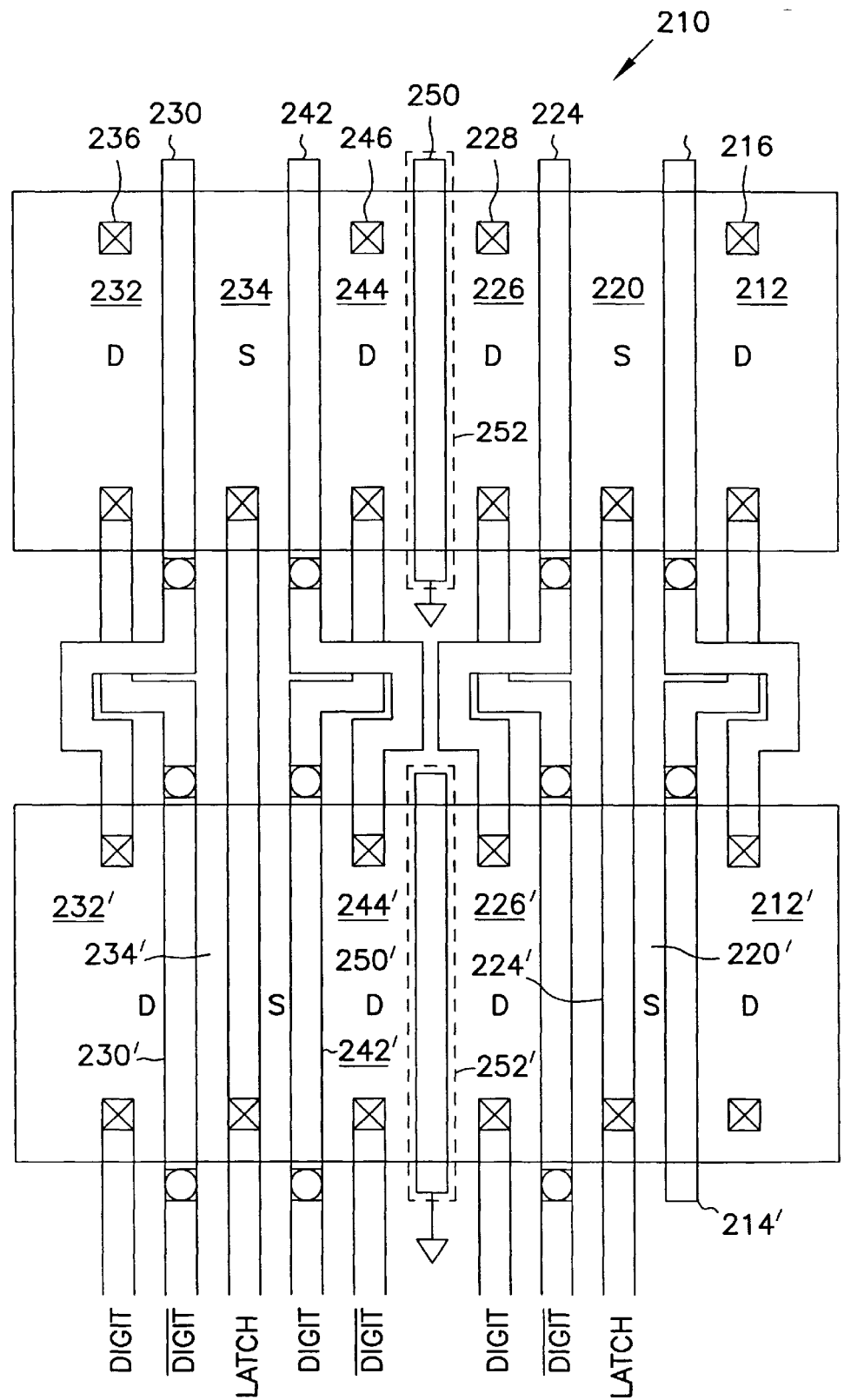
FIG. 3 is a planar view of two sets of transistors in FIG. 2 coupled as a sense amp.
Figure 4:
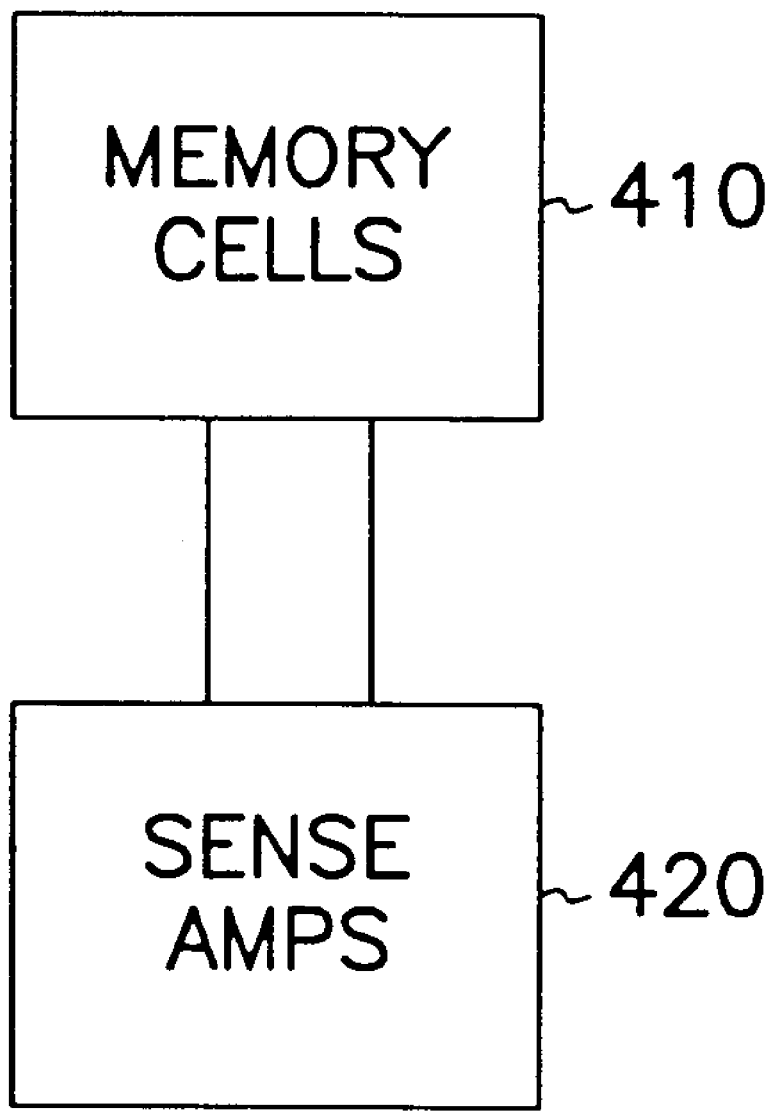
FIG. 4 is a simplified block diagram of on use of the isolated transistors as part of a memory device.

In one embodiment, transistors are cross coupled such that only one of them is on at any given time as shown in the planar diagram of FIG. 3 which shows the electrical connections formed in polysilicon, metal or other suitable conductors between two substantially identical sets of the elements of FIG. 2. The first set of elements is numbered consistently with FIG. 2, and the second set of identical elements uses the same reference numbers to identify like elements with the addition of an apostrophe. Drain 232 is coupled to gate 230', gate 230 is coupled to drain 232' and source 234 is coupled to source 234' to form a first cross coupled transistor pair. A second pair is formed by cross coupling gate 242 with drain 244' and gate 242' with drain 244 with the sources already coupled. Similar connections are made between the transistors on the other side of the isolating gate 250 and 250' to form further sets of cross coupled transistors. Such transistor pairs are very useful in forming sense amplifiers for dynamic random access memory devices as shown in the simplified block diagram of FIG. 4, where the memory cells are represented at 410, and the sense amplifiers are shown coupled to the cells at 420. In FIG. 3, connections to memory cell digit lines are indicated.

It is critical that sense amplifiers for memory devices be precisely balanced to ensure that the correct transistor turns on when sensing the state of a memory cell. Unbalancing caused by prior art field oxide isolation techniques can lead to incorrect sensing of the memory cells, especially where the spacing of unassociated transistors is too close as described above.

To provide for electrical isolation between the two sets of transistors, a polysilicon isolation gate is provided at 250, disposed between drains 226 and 244 of the adjacent transistors. In one embodiment where the doping of the drains is n+, the isolation gate 250 is tied to a low reference voltage, or ground. Where the doping of the drains is p+, the reference voltage comprises a supply voltage such as Vcc to ensure that a conductive channel is not formed. In further embodiments, the gate 250 may be any type of conductor compatible with the semiconductor materials chosen, and is usually formed of the same material as the other gates. A layer of insulative material 252 indicated by the broken line is formed prior to formation of the gate 250 to ensure that no direct electrical contact is made with the underlying active areas. The insulator 252 is formed of silicon dioxide, BPSG or other suitable insulative material.

Drain 226 of the second transistor, and drain 244 of the fourth transistor form the source and drain, or drain and source for an isolation transistor. The isolation transistor provides isolation with much less distance required between the pairs of active transistors. In essence, the isolation distance is merely the length of the channel area under the isolation gate 250, which in one embodiment is on the order of less than 1 micron. As will be appreciated by those skilled in the art, the length of the channel area may be modified based on the processes available to obtain the optimal isolation desired. However, such distances are generally much less than those required for field oxide based isolation techniques due to potential encroachment, and misalignment which can occur in process steps.

Since circuit density is greatly increasing with each new iteration of semiconductor dynamic access memory chips at an ever increasing rate, it is very important to obtain isolation between unassociated circuitry using as little space as possible. The present invention does away with many of the encroachment and misalignment problems of using field isolation. The gates for each of the transistors and the isolation gate 250 are all formed from a single mask, providing precise alignment. The invention takes advantage of the inherent isolation properties of enhancement mode field effect transistors in a tight memory cell layout. If depletion mode field effect transistors are used, a reference voltage sufficient to deplete the channel between the adjacent active areas should be used.

It should be noted that in many field effect transistors, the source and drain are essentially interchangeable, and interconnections specified herein should not be interpreted as solely limited to those described. In addition, while the transistors were described as n-channel transistors, it is recognized by those skilled in the art that a p-channel transistors may also be used if the structures are uniformly oppositely doped from that described. The n and p designations are used in the common manner to designate donor and acceptor type impurities which promote electron and hole type carriers respectively as the majority carriers. The "+" symbol, when used as a suffix with an impurity type shall be interpreted to mean that the doping concentration of that impurity is heavier than the doping associated with just the letter identifying the impurity type without the "+" suffix. It should also be noted that silicon is one preferred semiconductor material, but other semiconductor materials such as germanium, diamond, and gallium arsenide to name a few may also be used.

The above description is intended to be illustrative, and not restrictive. Many other embodiments will be apparent to those of skill in the art upon reviewing the above description. The scope of the invention should, therefore, be determined with reference to the appended claims, along with the fill scope of equivalents to which such claims are entitled.

What is claimed is:

1. An integrated circuit comprising:
a semiconductor substrate having a plurality of field-effect transistors formed directly therein and interconnected into a circuit,
a first of the transistors having first and second active areas and a gate forming a first channel and coupled to others of the transistors in the circuit,
a second of the transistors having third and fourth active areas and a gate forming a second channel and coupled to others of the transistors in the circuit, the third active area being disposed adjacent the second active area,
a third of the transistors sharing the fourth active area with the second transistor and having a fifth active area and a gate forming a third channel and coupled to others of the transistors in the circuit;
an isolation gate for forming an isolation channel between the second and third active areas, the isolation gate being coupled to a voltage such that the isolation gate always reverse biases the isolation channel, the isolation channel having the same structure as at least one of the first, second, and third channels.

2. The integrated circuit of claim 1, where the first through fifth active areas have an n-type doping.

3. The integrated circuit of claim 2, where the constant voltage is a ground potential.

4. The integrated circuit of claim 1, where the first through fifth active areas have a p-type doping.

5. The integrated circuit of claim 4, where the constant voltage is a supply potential.

6. The integrated circuit of claim 1 further comprising:
a fourth transistor sharing the first active area with the first transistor, and having a sixth active area and a gate coupled to others of the transistors in the circuit.

7. The integrated circuit of claim 1 wherein all of the first, second, third, and isolation gates have the same structure.

8. An integrated circuit comprising:
a semiconductor substrate having a plurality of field-effect transistors formed directly therein and interconnected into a circuit,
a first of the transistors having first and second active areas and a gate coupled to others of the transistors in the circuit,
a second of the transistors having third and fourth active areas and a gate coupled to others of the transistors in the circuit, the third active area being disposed adjacent the second active area,
a third of the transistors sharing the fourth active area with the second transistor and having a fifth active area and a gate coupled to others of the transistors in the circuit;
an isolation gate disposed directly over the substrate and forming an isolation channel between the second and third active areas, the isolation gate being coupled to a voltage such that the isolation gate always reverse biases the isolation channel.

9. The integrated circuit of claim 8 wherein all of the gates are disposed directly over the substrate.

10. The integrated circuit of claim 8 further comprising a fourth of the transistors sharing the first active area with the first transistor, and having a sixth active area and a gate coupled to others of the transistors in the circuit.

11. The integrated circuit of claim 8, where the first through sixth active areas have an n-type doping.

12. The integrated circuit of claim 11, where the constant voltage is a ground potential.

13. The integrated circuit of claim 8, where the first through sixth active areas have a p-type doping.

14. The integrated circuit of claim 13, where the constant voltage is a supply potential.

15. An integrated circuit comprising:
a plurality of field-effect transistors disposed in a semiconductor substrate and interconnected so as to perform a circuit function;
a first of the transistors having first and second active areas in the substrate for performing the circuit function;
a second of the transistors having third and fourth active areas in the substrate for performing the circuit function, the third active area being disposed adjacent the second active area;
a third of the transistors sharing the fourth active area with the second transistor and further having a fifth active area separated from the first and second transistors;
an isolation gate for forming an isolation channel disposed directly between the third and fourth active areas;
a connection to a constant voltage sufficient to reverse-bias the isolation channel as the first and second transistors perform the circuit function.

16. The integrated circuit of claim 15 wherein only the substrate intervenes between the second and third active areas below an upper surface thereof.

17. The integrated circuit of claim 15 wherein the doping of the substrate under the isolation gate is the same as the doping of the substrate under at least one of the other gates.

18. The integrated circuit of claim 15 wherein the isolation gate is at the same height above the substrate as that of at least one of the other gates.

19. The integrated circuit of claim 15 wherein the isolation channel includes no layers other than the substrate itself.

20. The integrated circuit of claim 15, where the first through fourth active areas have an n+ doping.

21. The integrated circuit of claim 20, where the constant voltage is a ground potential.

22. The integrated circuit of claim 15, where the second and third active areas form drains of the first and second transistors, respectively.

23. In an integrated circuit having a plurality of field-effect transistors formed directly in a semiconductor substrate for performing a circuit function, a structure comprising:
a continuous doped layer having first, second, third, fourth, and fifth active areas formed directly in the substrate;
first, second, third, and fourth gates disposed between all mutually adjacent ones of the active areas for forming first, second, third, and fourth channels all having the same structure;
a connection for coupling the second gate to a constant potential for reverse biasing the second channel at all times;
further connections for coupling the first, third, and fourth gates to perform the circuit function.

24. The structure of claim 23, where the first, second, and third gates have substantially the same width.

25. The structure of claim 24, where all five active areas are disposed in a single row.

26. The structure of claim 23, where all five of the active areas perform a circuit function.

27. The integrated circuit of claim 23, where the first through fifth active areas have an n-type doping, and where the constant voltage is a ground potential.

28. The integrated circuit of claim 23, where the first through fifth active areas have a p-type doping, and where the constant voltage is a supply potential.

29. The integrated circuit of claim 23 wherein only the substrate itself intervenes laterally between the mutually adjacent ones of the active areas.

30. The integrated circuit of claim 23 wherein only the reverse biasing electrically isolates the second active area from the third active area.

31. The integrated circuit of claim 23 wherein the first, second, third, and fourth gates all have the same structure.

32. The integrated circuit of claim 31 wherein the first, second, third, and fourth gates all have the same height above the substrate.

* * * * *